(12) United States Patent
Tolson

(10) Patent No.: US 6,208,850 B1
(45) Date of Patent: Mar. 27, 2001

(54) DIRECT CONVERSION RECEIVER PER-SELECTION

(75) Inventor: Nigel James Tolson, Berkshire (GB)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/203,386

(22) Filed: Dec. 2, 1998

(30) Foreign Application Priority Data

Dec. 4, 1997 (GB) .................................................. 9725674

(51) Int. Cl.$^7$ ........................................................ H03B 1/10
(52) U.S. Cl. .......................... 455/317; 455/307; 455/339
(58) Field of Search ..................................... 455/324, 266, 455/323, 340, 310, 317, 307, 260, 337, 338, 339; 375/346

(56) References Cited

U.S. PATENT DOCUMENTS 4,965,853 * 10/1990 Barnard ................................. 455/209
5,781,851 * 7/1998 Saito .................................. 455/182.1
5,943,370 * 8/1999 Smith .................................... 375/334

FOREIGN PATENT DOCUMENTS

| 991505 | 5/1965 | (GB) . |
| 2 040 615 | 8/1980 | (GB) . |
| 2 101 822 | 1/1983 | (GB) . |

* cited by examiner

Primary Examiner—Reinhard Eisenzopf
Assistant Examiner—Charles N. Appiah
(74) Attorney, Agent, or Firm—Sughrue, Mion, Zinn, Macpeak & Seas, PLLC

(57) ABSTRACT

A tunable voltage controlled bandpass filter for a direct conversion receiver. A phase locked loop uses the phase change imparted by the bandpass filter to local oscillator breakthrough from the mixer for a measure of frequency difference between input RF and local oscillator output. An error voltage derived from the measured phase change is applied as a tuning control to the bandpass filter. A sample and hold arrangement allows disconnection of the tuning circuit for power saving. The filter is suitable for implementation as an integral part of an ASIC receiver.

16 Claims, 1 Drawing Sheet

DIRECT CONVERSION RECEIVER PER-SELECTION

Figure 1:
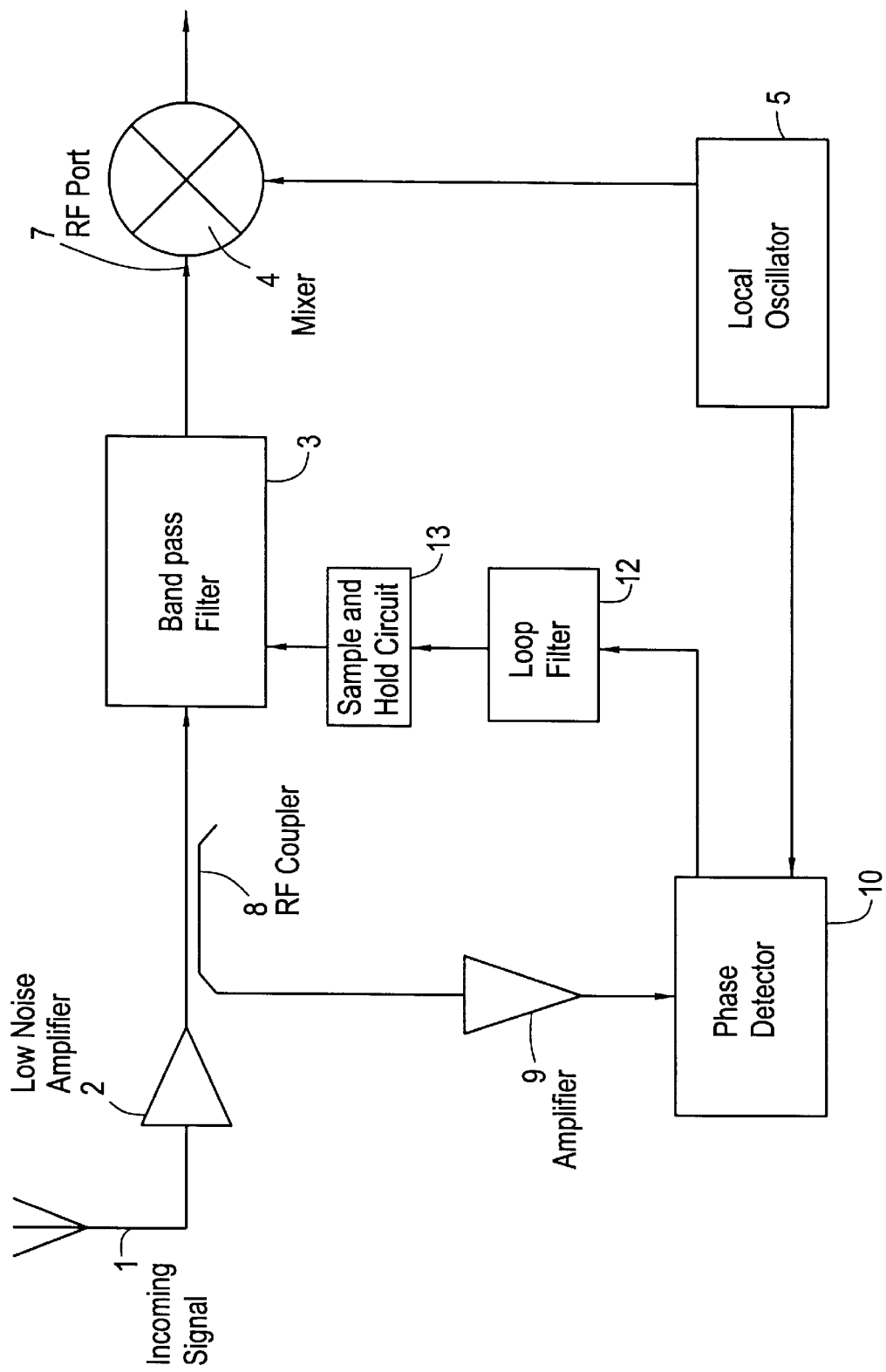

This invention relates to direct conversion receivers and in particular it relates to an arrangement for control of a pre-selection bandpass filter.

FM receivers constructed to convert incoming radio frequency (RF) modulation directly to the baseband are well known and the prior art is described e.g. in U.S. Pat. No. 4,653,117.

In direct conversion receivers, the frequency of a local oscillator in the receiver is made equal to the incoming RF carrier frequency such that the modulation of the incoming signal is converted directly to baseband.

A pre-selection filter as referred to herein is a band pass filter operating at the RF frequency and preceding the first down conversion stage of the receiver channel. The purpose of the pre-selection filter is to remove large unwanted signals.

The filter normally used would be a ceramic or surface acoustic wave type set to operate at fixed frequency and having a bandwidth to cover the working band of interest e.g. 25 MHz for GSM. Within the working band of interest there is a number of channels, the bandwidths of these channels being much less than the working band e.g. 200 KHz channel bandwidth for GSM.

The extent of the bandwidth of the pre-selection filter has an effect such that the selectivity of this filter largely determines the performance of the receiver. A minimum bandwidth for the pre-selection filter, consistent with adequate reception of the wanted signal would enhance receiver performance considerably.

It is an object of the invention to provide a simple tunable band pass filter capable of implementation as an integral part of an ASIC receiver.

A pre-selector filter of narrow bandwidth (e.g. 1 MHz for the GSM example given above), with the ability to track the single channel of interest at any one time would therefore greatly improve receiver performance.

According to the invention there is provided A tunable pre-selector filter for a direct conversion receiver comprising a voltage controlled band pass filter, receiving an RF input and feeding the filtered RF from the voltage controlled band pass filter as an input to a mixer for mixing with an output of a local oscillator, the output of the local oscillator being fed also to a phase detector for comparison with a local oscillator output obtained as leakage from the mixer having passed through the voltage controlled band pass filter and an output from the phase detector applied through a loop filter as a control voltage to the voltage controlled band pass filter.

An example of the invention will now be described with reference to the sole FIG. 1 which is a block diagram of a voltage controlled pre-selector filter and control loop therefor.

With reference to FIG. 1, an incoming signal 1 is amplified in low noise amplifier 2. The function of low noise amplifier 2 is to enhance the signal to noise performance of the receiver and to reduce any unwanted transmission from the receiving antenna at radio frequencies. The amplified signal from 2 is connected to voltage controlled band pass filter 3. Filter 3 may be constructed as an MMIC active filter, a description of which may be found in IEEE Transactions on microwave theory and techniques Volume 37 number 12 December 1989, Manfred J. Schindler and Yusuke Tajima. The bandwith of filter 3 is sufficient to accommodate a single channel.

The RF signals exiting filter 3 are fed to mixer 4. Local oscillator 5 provides an output at the frequency of the reception channel required. The output of local oscillator 5 is fed to mixer 4 and the output from mixer 4 is fed to a standard direct conversion baseband circuit.

The isolation of the local oscillator signal from the incoming RF port provided by mixer 4 is typically only 15 dB and therefore a substantial breakthrough of the local oscillator energy to the RF port at 7 occurs. The RF energy from the Local oscillator appearing at RF port 7 passes through filter 3 with a change of phase. The amount and direction of the phase change of the local oscillator breakthrough passing through the filter 3 is determined by the difference between the frequency of the local oscillator breakthrough and the current centre frequency of the tunable filter 3. The local oscillator energy passing through filter 3 is coupled via RF coupler 8 to amplifier 9, where it is amplified and applied to a port of phase detector 10. A further output from local oscillator 5 is fed to a second port 11 of phase detector 10. Phase detector 10 compares the phase of the signals appearing at its ports and provides an output proportional to the difference in phase of the two signals.

The output from phase detector 10, the error signal, is fed to loop filter 12 and the output voltage from the loop filter is applied, via sample and hold circuit 13 to the voltage control input of the voltage controlled filter 3 thereby forming a phase locked loop. The action of the phase locked loop is to drive the centre frequency of the passband of filter 3 towards the frequency of the local oscillator, the local oscillator frequency having been set for use with the selected operating channel.

A sample and hold circuit 13 is included in the control loop between loop filter 12 and voltage controlled filter 3. The sample and hold circuit is capable of being switched to provide a fixed voltage at the control input of the voltage controlled band pass filter 3. When the control voltage for filter 3 is be maintained at a fixed value parts of the control circuit are disabled thereby to effect a saving of power during normal operation of the telephone in a single channel.

The phase locked loop does not operate while the sample and hold circuit 13 supplies a fixed voltage to control filter 3. When a different channel is selected the phase locked loop circuit is enabled and the filter is tuned to accept the new channel frequencies.

It should be noted that the low noise amplifier is not essential to the working of the pre-selector.

What is claimed is:

1. A tunable pre-selector filter for a direct conversion receiver comprising a voltage controlled band pass filter, receiving an RF input and feeding the filtered RF from the voltage controlled band pass filter as an input to a mixer for mixing with an output of a local oscillator, the output of the local oscillator being fed also to a phase detector for comparison with a local oscillator output obtained as leakage from the mixer having passed through the voltage controlled band pass filter and an output from the phase detector applied through a loop filter as a control voltage to the voltage controlled band pass filter.

2. A tunable pre-selector filter as in claim 1 in which the local oscillator output obtained as leakage from the mixer having passed through the voltage controlled band pass filter is fed to the phase detector via an RF coupler and amplifier.

3. A tunable pre-selector filter as in claim 1 in which the output from the loop filter to the voltage controlled band pass filter is via a sample and hold circuit, the sample and hold circuit being switched to supply fixed voltage at the control input of the voltage controlled band pass filter when the tuning control loop is not required to operate.

4. A tunable pre-selector filter as in claim 2 in which the output from the loop filter to the voltage controlled band pass filter is via a sample and hold circuit, the sample and hold circuit being switched to supply fixed voltage at the control input of the voltage controlled band pass filter when the tuning control loop is not required to operate.

5. A tunable pre-selector filter as in claim 1 in which the voltage controlled band pass filter is an active filter.

6. A tunable pre-selector filter as in claim 2 in which the voltage controlled band pass filter is an active filter.

7. A tunable pre-selector filter as in claim 3 in which the voltage controlled band pass filter is an active filter.

8. A tunable pre-selector filter as in claim 4 in which the voltage controlled band pass filter is an active filter.

9. A tunable pre-selector filter as in claim 1 implemented as an I integral part of an ASIC receiver.

10. A tunable pre-selector filter as in claim 2 implemented as an I integral part of an ASIC receiver.

11. A tunable pre-selector filter as in claim 3 implemented as an I integral part of an ASIC receiver.

12. A tunable pre-selector filter as in claim 4 implemented as an I integral part of an ASIC receiver.

13. A tunable pre-selector filter as in claim 5 implemented as an I integral part of an ASIC receiver.

14. A tunable pre-selector filter as in claim 6 implemented as an I integral part of an ASIC receiver.

15. A tunable pre-selector filter as in claim 7 implemented as an I integral part of an ASIC receiver.

16. A tunable pre-selector filter as in claim 8 implemented as an I integral part of an ASIC receiver.

* * * * *

UNITED STATES PATENT AND TRADEMARK OFFICE
CERTIFICATE OF CORRECTION

PATENT NO. : 6,208,850 B1
DATED : March 27, 2001
INVENTOR(S) : Nigel James Tolson It is certified that error appears in the above-identified patent and that said Letters Patent is hereby corrected as shown below:

<u>Title page,</u>
Item [30], delete "Priority Data 9725674" insert -- 9725674.7 --

Signed and Sealed this

Thirteenth Day of August, 2002

*Attest:*

*Attesting Officer*

JAMES E. ROGAN
*Director of the United States Patent and Trademark Office*